(12) United States Patent
Kezuka et al.

(10) Patent No.: US 7,404,910 B1
(45) Date of Patent: Jul. 29, 2008

(54) ETCHING SOLUTION, ETCHED ARTICLE AND METHOD FOR ETCHED ARTICLE

(75) Inventors: Takehiko Kezuka, Settsu (JP); Makoto Suyama, Settsu (JP); Mitsushi Itano, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/856,358

(22) PCT Filed: Nov. 22, 1999

(86) PCT No.: PCT/JP99/06502

§ 371 (c)(1), (2), (4) Date: May 22, 2001

(87) PCT Pub. No.: WO00/31785

PCT Pub. Date: Jun. 2, 2000

(30) Foreign Application Priority Data

Nov. 24, 1998 (JP) ................... 10-332782

(51) Int. Cl.
*B44C 1/22* (2006.01)
(52) U.S. Cl. .............. 216/103; 216/106; 216/108; 252/79.1; 252/79.2
(58) Field of Classification Search ........... 438/745, 438/756; 252/79.1, 79.2, 79.3, 79.4; 257/636; 216/103
See application file for complete search history.

(56) References Cited

U.S. PATENT DOCUMENTS

| | | | | |
|---|---|---|---|---|
| 3,518,135 A | | 6/1970 | Cerniglia et al. | |
| 3,968,565 A | * | 7/1976 | Bertens et al. | 438/3 |
| 3,977,925 A | * | 8/1976 | Schwabe | 438/424 |
| 3,997,381 A | * | 12/1976 | Wanlass | 156/3 |
| 4,052,253 A | | 10/1977 | Kingzett | |
| 4,273,826 A | * | 6/1981 | McCollister et al. | 428/310.5 |
| 4,395,304 A | | 7/1983 | Kern et al. | |
| 5,112,437 A | * | 5/1992 | Watanabe et al. | 156/646 |
| 5,294,568 A | * | 3/1994 | McNeilly et al. | 438/706 |
| 5,439,553 A | * | 8/1995 | Grant et al. | 216/58 |
| 5,571,375 A | | 11/1996 | Izumi et al. | |
| 5,658,417 A | * | 8/1997 | Watanabe et al. | 156/345 |
| 5,716,535 A | * | 2/1998 | Lee et al. | 216/99 |
| 5,783,495 A | * | 7/1998 | Li et al. | 438/738 |
| 5,824,601 A | | 10/1998 | Dao et al. | |

FOREIGN PATENT DOCUMENTS

| | | |
|---|---|---|
| EP | 0 669 646 | 8/1995 |
| EP | 0 887 323 | 12/1998 |
| EP | 1150342 A1 * | 10/2001 |
| EP | 1168424 A1 * | 1/2002 |
| JP | 52-56869 | 5/1977 |
| JP | 1977-056869 | 5/1977 |
| JP | 58-204540 | 11/1983 |
| JP | 1983-204540 | 11/1983 |
| JP | 60-64437 | 4/1985 |
| JP | 11-74249 | 3/1999 |
| WO | WO 94/27314 | 11/1994 |

* cited by examiner

*Primary Examiner*—Binh X Tran
*Assistant Examiner*—Maki Angadi
(74) *Attorney, Agent, or Firm*—B. Aaron Schulman; Stites & Harbison PLLC

(57) ABSTRACT

An etching solution which contains hydrogen fluoride (HF) and exhibits an etching rate ratio: etching rate for a boron-glass film (BSG) or boron-phosphorus-glass film (BPSG)/ etching rate for a thermally oxidized film (THOX) of 10 or more at 25° C.

8 Claims, No Drawings

ETCHING SOLUTION, ETCHED ARTICLE AND METHOD FOR ETCHED ARTICLE

TECHNICAL FIELD

The present invention relates to an etching solution, a method for producing an etched article and an etched article produced by the method, more specifically, an etching solution and a method for producing an etched article for selectively etching a doped oxide film, particularly BSG or BPSG relative to an undoped oxide film, particularly THOX, and an etched article produced by the method.

BACKGROUND ART

Conventionally, as etchants for silicon wafers and the like have been used buffered hydrofluoric acids comprising HF (50% by weight) and $NH_4F$ (40% by weight) at such a ratio that can achieve a desired etch rate.

However, the buffered hydrofluoric acids etch not only doped oxide films such as BSG films, BPSG films, phosphosilicate glass (PSG) films, arsenic silicate glass (AsSG) films and the like, but also undoped oxide films such as USG including TEOS (oxide obtained by CVD method using tetraethoxysilane gas) films, THOX and the like. Therefore, the buffered hydrofluoric acids can not selectively etch the doped oxide films.

An object of the present invention is to provide an etching solution and an etching method for selectively etching oxide films doped with impurities relative to TEOS and THOX.

DISCLOSURE OF INVENTION

The present invention relates to the items 1-16 listed below.

Item 1: An etching solution comprising hydrofluoric acid, wherein an a ratio of etch rate of a boron silicate glass film (BSG) or boron phosphosilicate glass / an etch rate of a thermal oxide film (THOX) at 25° C. is 10 or higher.

Item 2: The etching solution according to item 1, wherein a solvent in the etching solution has a relative dielectric constant of 61 or lower.

Item 3: The etching solution according to item 1, the solution containing at least one member selected from the group consisting of an organic acid and an organic solvent having a hetero atom.

Item 4: The etching solution according to item 1, the solution containing (i) water and (ii) at least one member selected from the group consisting of an organic acid and an organic solvent having a hetero atom, the water being contained in a concentration of 70% by weight or lower.

Item 5: The etching solution according to item 1, wherein the weight ratio of HF:isopropyl alcohol:water is 0.1-50% by weight: 30-99% by weight: 0-70% by weight.

Item 6: The etching solution according to item 1, wherein the weight ratio of HF:acetic acid:water is 0.1-50% by weight: 30-99.9% by weight: 0-70% by weight.

Item 7: The etching solution according to item 1, wherein the weight ratio of HF:tetrahydrofuran:water is 0.1-50% by weight: 30-99.9% by weight: 0-70% by weight.

Item 8: The etching solution according to item 1, wherein the weight ratio of HF: acetone:water is 0.1-50% by weight: 30-99.9% by weight: 0-70% by weight.

Item 9: The etching solution according to item 1, wherein the weight ratio of HF: methanol : water is 0.1-50% by weight: 30-99.9% by weight: 0-70% by weight.

Item 10: The etching solution according to item 1, wherein the weight ratio of HF:ethanol:water is 0.1-50% by weight: 30-99.9% by weight: 0-70% by weight.

Item 11: The etching solution according to item 1, the solution comprising an inorganic acid.

Item: 12 The etching solution according to item 11, wherein the inorganic acid has a pKa value at 25° C. of 2 or lower.

Item 13: The etching solution according to item 11, wherein the weight ratio of HF:HCl:water is 0.01-50% by weight: 1-36% by weight: 0-99% by weight.

Item 14: The etching solution according to item 11, wherein the weight ratio of $HF:HNO_3$:water is 0.01-50% by weight: 1-70% by weight: 0-99% by weight.

Item 15: A method for producing an etched article by etching an article to be etched with the etching solution as defined in any of items 1-14.

Item 16: An etched article which is obtainable by the method of item 15.

According to the etching solution of the invention, the ratio of BSG etch rate/THOX etch rate and/or the ratio of BPSG etch rate/THOX etch rate at 25° C. is/are 10 or higher, preferably 20 or higher, more preferably 50 or higher, particularly 100 or higher.

In case of using TEOS instead of THOX, the ratio of BSG etch rate/TEOS etch rate and/or the ratio of BPSG etch rate/ TEOS etch rate at 25° C. is/are 5 or higher, preferably 10 or higher, more preferably 50 or higher, particularly 100 or higher.

The etch rate of the etching solution of the invention can be calculated as the difference in thickness of a film (BSG; BPSG; THOX; TEOS and like USG, etc.) before and after etching divided by etch time.

The water content is not higher than 70% by weight, preferably not higher than 30% by weight, more preferably about 30-5% by weight. The relative dielectric constant of the etching solution expresses an arithmetic mean of the relative dielectric constants of the components of the etching solutions other than the HF and inorganic acid.

Preferable examples of the inorganic acid include inorganic acids having a pKa value at 25° C. of 2 or lower, for example, hydrochloric acid (pKa =−8), nitric acid (pKa=− 1.8), hydrobromic acid (pKa=−9), hydroiodic acid (pKa=− 10) and perchloric acid (a pKa-unmeasurably strong acid).

Examples of the organic acid include acetic acid (relative dielectric constant: 6.15 (20° C.)), propionic acid (relative dielectric constant: 3.4 (40° C.)), butyric acid (relative dielectric constant: 2.97(20° C.)), isobutyric acid (relative dielectric constant: 2.73(40° C.)), valeric acid, caproic acid (relative dielectric constant: 2.63(71° C.)), caprylic acid (relative dielectric constant: 2.45(20° C.)), monochloroacetic acid (relative dielectric constant: 21 (20° C.)), dichloroacetic acid (relative dielectric constant: 8.08(20° C.)), trichloroacetic acid (relative dielectric constant: 4.6 (60° C.)), monofluoroacetic acid, difluoroacetic acid, trifluoroacetic acid, α-chlorobutyric acid, β-chlorobutyric acid, γ-chlorobutyric acid, lactic acid (relative dielectric constant: 22(70° C.)), glycolic acid, pyruvic acid, glyoxalic acid, acrylic acid and like monocarboxylic acids, methanesulfonic acid, toluenesulfonic acid and like sulfonic acids, oxalic acid, succinic acid, adipic acid, tartaric acid, citric acid and like polycarboxylic acids.

Examples of the organic solvent having a hetero atom include methanol (relative dielectric constant: 32.6 (25° C.)), ethanol (relative dielectric constant: 24.6 (25° C.)), isopropanol (IPA, relative dielectric constant: 19.9 (25° C.)), 1-propanol (relative dielectric constant: 22.2 (25° C.)), 1-butanol (relative dielectric constant: 17.1 (25° C.)), 2-butanol (relative dielectric constant: 15.5 (19° C.)), t-butanol (relative dielectric constant: 11.4 (19° C.)), 2-methyl-1-propanol (relative dielectric constant: 17.95 (20° C.)), 1-pentanol (relative dielectric constant: 13.9 (25° C.)), 1-hexanol (relative dielectric constant: 13.3 (25° C.)), 1-heptanol, 4-heptanol, 1-octanol (relative dielectric constant: 10.34 (20° C.)), 1-nonylalcohol, 1-decanol, 1-dodecanol and like alcohols; ethylene glycol (relative dielectric constant: 37.7 (20° C.)), 1,2-propanediol (relative dielectric constant: 32.0 (20° C.)), 2,3-butanediol, glycerin (relative dielectric constant: 42.5 (25° C.)) and like polyols, acetone (relative dielectric constant: 20.7 (25° C.)), acetylacetone, methyl ethyl ketone (relative dielectric constant: 18.51 (20° C.)) and like ketones; acetonitrile (relative dielectric constant: 37.5 (20° C.)), propionitrile (relative dielectric constant: 29.7 (20° C.)), butyronitrile (relative dielectric constant: 20.3 (20° C.)), isobutyronitrile (relative dielectric constant: 20.4 (20° C.)), benzonitrile (relative dielectric constant: 25.2 (25° C.)) and like nitriles; formaldehyde, acetaldehyde, propionaldehyde and like aldehydes; ethylene glycol monomethyl ether, ethylene glycol monoethyl ether and like alkylene glycol mono alkyl ethers; tetrahydrofuran (relative dielectric constant: 7.6 (25° C.)), dioxane (relative dielectric constant: 2.2 (25° C.)) and like ethers, trifluoroethanol, pentafluoropropanol, 2,2,3,3-tetrafluoro propanol and like fluorine alcohols, sulfolane (relative dielectric constant: 43.3 (20° C.)), nitromethane (relative dielectric constant: 35.87 (30° C.)) and the like.

The relative dielectric constant of water is 78.3 (25° C.).

The content of HF is about 0.01-50% by weight, preferably about 1-5% by weight.

The water content is not higher than 70% by weight, preferably not higher than 30% by weight, more preferably about 0-5% by weight.

The content of the inorganic acid is about 1-99% by weight, preferably about 30-70% by weight.

The content of the organic acid is about 30-99.9% by weight, preferably about 70-99.9% by weight.

The content of the organic solvent having a hetero atom is about 30-99.9% by weight, preferably about 70-99.9% by weight.

The content of at least one member selected from the group consisting of the inorganic acid, organic acid and organic solvent having a hetero atom is about 30-99.9% by weight, preferably about 70-99.9% by weight.

The inorganic acid has a pKa at 25° C. of about 2 or lower, preferably about −5 or lower.

The relative dielectric constant of the organic acid and organic solvent having an hetero atom is preferably about 40 or lower, more preferably about 10 or lower.

As the HF is usually used dilute hydrofluoric acid (50 wt. % aqueous solution). However, when the HF does not contain water, 100% HF may be also used.

In case of HCl, HBr and HI, an anhydrous etching solution can be prepared by blowing these gases through the etching solution.

Preferable etching solutions of the present invention and their compositions are shown below.

HF:IPA:water=1-10% by weight: 70-99% by weight 0-30% by weight

HF:acetic acid:water=0.5-5% by weight: 70-99.5% by weight: 0-30% by weight

HF:HCl:water=0.01-5% by weight: 1-36% by weight 50-99% by weight

HF:nitric acid:water=0.01-5% by weight: 1-70% by weight: 20-99% by weight

HF:acetone:water=1-10% by weight: 70-99% by weight: 0-30% by weight

HF:THF:water=1-10% by weight: 70-99% by weight 0-30% by weight

HF:methanol:water=1-10% by weight: 70-99% by weight: 0-30% by weight

HF:ethanol:water=1-10% by weight: 70-99% by weight: 0-30% by weight

The etching solution of the invention can be suitably used for selectively etching a doped oxide film of an article to be etched comprising an oxide film (BSG, BPSG, etc.) doped with B, P and the like and an undoped oxide film such as THOX, TEOS and like.

In the etching method of the present invention, the temperature of the etching solution is about 15-40° C.

Examples of the article to be etched include single crystalline silicon wafers, gallium-arsenic wafers and like wafers, especially the articles comprising a doped oxide film (BSG, BPSG, etc.) and an undoped oxide film (THOX, TEOS and like USGs).

The BSG etch rate of the etching solution of the invention is usually about 10-2000 nm/min, preferably about 40-500 nm/min.

The present invention can provide an etching solution which can selectively etch films doped with impurities, such as BSG, BPSG and the like, relative to THOX, TEOS and like USG, a method for producing an etched article using the etching solution and an etched article.

BEST MODE FOR CARRYING OUT THE INVENTION

The present invention will be explained in more detail with referring to Examples and Comparative Examples below.

EXAMPLES 1-2 AND COMPARATIVE EXAMPLES 1-4

(Inorganic Acid)

Etching solutions were prepared by mixing HF, water, an organic solvent having a hetero atom (isopropyl alcohol (IPA), THF, acetone, methanol, ethanol), an organic acid (acetic acid) and inorganic acid (HCl, $HNO_3$) in the ratios shown in Table 1. Test substrates were produced by forming each of a thermal oxide (THOX) film, USG (TEOS) film, boron silicate glass (BSG) film and boron phosphosilicate glass (BPSG) film on a silicon substrate by CVD method using a tetraethoxysilane gas. The etch rate and etch selectivity of the etching solutions on the test substrates were determined.

In addition, the etch rate and selectivity of conventional HF-$H_2O$ and HF-$NH_4F$-$H_2O$ etching solutions were determined in the above-mentioned manner as Comparative Examples.

The etch rate was determined by measuring the thickness of the films before and after etching with an Auto EL-III ellipsometer manufactured by Rudolf Research.

The etch rates of the etching solutions were calculated as the difference in thickness of films before and after being etched at 25° C. divided by etch time.

The results of the etching solutions with each composition are shown in Table 1 to Table 8.

The relative dielectric constant is that of a solvent (an organic solvent having a hetero atom or an organic acid)+water at 25° C., expressed as a calculated value of an average of the relative dielectric constants of the solvent and water having the particular composition.

Average of relative dielectric constants=[78.3×(percentage by weight of water)+(relative dielectric constant of solvent at 25° C.)×(percentage by weight of solvent)]/[(percentage by weight of water)+(percentage by weight of solvent)]

HF-H₂O-isopropyl alcohol (PA) etchant

| | Solvent | Relative dielectric constant of solvent | HF concentration (%) | Water concentration (%) | Solvent (IPA) concentration (%) | Relative dielectric constant of solvent (IPA) + water (calculated value) | THOX etch rate (A/min.) | TEOS etch rate (A/min.) | BSG etch rate (A/min.) | BPSG etch rate (A/min.) | BSG/THOX selectivity | BPSG/THOX selectivity | BSG/TEOS selectivity | BPSG/TEOS selectivity |
|---|---|---|---|---|---|---|---|---|---|---|---|---|---|---|
| Ex. 1 | IPA | 19.9 | 5 | 5 | 90 | 23.0 | 12 | 11 | 370 | 330 | 31 | 28 | 34 | 30 |
| Ex. 2 | IPA | 19.9 | 5 | 25 | 70 | 35.3 | 55 | 76 | 920 | 1160 | 17 | 21 | 12 | 15 |
| Ex. 3 | IPA | 19.9 | 5 | 45 | 50 | 47.6 | 97 | 140 | 1190 | 1650 | 12 | 17 | 8.5 | 12 |
| Ex. 4 | IPA | 19.9 | 5 | 65 | 30 | 59.9 | 140 | 200 | 1450 | 1950 | 10 | 14 | 7.3 | 9.8 |
| Ex. 5 | IPA | 19.9 | 3 | 3 | 94 | 21.7 | 2 | 3 | 120 | — | 60 | — | 40 | — |
| Ex. 6 | IPA | 19.9 | 10 | 10 | 80 | 26.4 | 59 | 82 | 2200 | — | 37 | — | 27 | — |
| Ex. 7 | IPA | 19.9 | 15 | 15 | 70 | 30.2 | 350 | 230 | 6500 | — | 28 | — | 19 | — |
| Ex. 8 | IPA | 19.9 | 20 | 20 | 60 | 34.5 | 820 | 1200 | 12000 | — | 15 | — | 10 | — |
| Comp. Ex. 1 | (Water) | (78.3) | 1 | 99 | 0 | — | 58 | 93 | 380 | — | 6.5 | — | 4.1 | — |
| Comp. Ex. 2 | (Water) | (78.3) | 2 | 98 | 0 | — | 120 | 190 | 750 | — | 6.3 | — | 3.9 | — |
| Comp. Ex. 3 | (Water) | (78.3) | 3 | 95 | 0 | — | 300 | 490 | 1980 | — | 6.6 | — | 4.0 | — |
| Ex. 9 | Acetic acid | 6.15 | 1 | 1 | 98 | 6.88 | 10 | 14 | 530 | 750 | 53 | 75 | 38 | 54 |
| Ex. 10 | Acetic acid | 6.15 | 1.25 | 1.25 | 97.5 | 7.06 | 12 | 18 | 1200 | 940 | 100 | 78 | 67 | 52 |
| Ex. 11 | Acetic acid | 6.15 | 1.5 | 1.5 | 97 | 7.25 | 17 | 22 | 1600 | 1300 | 94 | 76 | 73 | 59 |
| Ex. 12 | Acetic acid | 6.15 | 2 | 2 | 96 | 7.62 | 25 | 33 | 2600 | — | 100 | — | 79 | — |
| Ex. 13 | Acetic acid | 6.15 | 2.5 | 2.5 | 95 | 8 | 32 | 45 | 3600 | — | 110 | — | 80 | — |
| Ex. 14 | Acetic acid | 6.15 | 3 | 3 | 94 | 8.38 | 40 | 55 | 4600 | — | 120 | — | 84 | — |
| Ex. 15 | Acetic acid | 6.15 | 5 | 5 | 90 | 9.95 | 97 | 140 | 8900 | — | 92 | — | 64 | — |
| Ex. 16 | Acetic acid | 6.15 | 1.25 | 5 | 93.75 | 9.80 | 18 | 23 | 1600 | — | 89 | — | 70 | — |
| Ex. 17 | Acetic acid | 6.15 | 1.25 | 10 | 88.75 | 13.5 | 20 | 32 | 1300 | — | 65 | — | 41 | — |
| Ex. 18 | Acetic acid | 6.15 | 1.25 | 20 | 78.75 | 20.8 | 32 | 46 | 970 | — | 30 | — | 21 | — |
| Ex. 19 | Acetic acid | 6.15 | 1.25 | 30 | 68.75 | 28.1 | 39 | 58 | 830 | — | 21 | — | 14 | — |
| Ex. 20 | Acetic acid | 6.15 | 1.25 | 40 | 58.75 | 35.4 | 40 | 65 | 670 | — | 17 | — | 10 | — |
| Ex. 21 | Acetic acid | 6.15 | 1.25 | 50 | 48.75 | 42.7 | 43 | 72 | 590 | — | 14 | — | 8.2 | — |
| Ex. 22 | THF | 7.6 | 5 | 5 | 90 | 11.3 | 3 | 4 | 510 | 330 | 170 | 110 | 130 | 83 |
| Ex. 23 | THF | 7.6 | 5 | 25 | 70 | 26.2 | 31 | 42 | 690 | 830 | 22 | 27 | 16 | 20 |
| Ex. 24 | THF | 7.6 | 5 | 45 | 50 | 41.1 | 64 | 85 | 890 | 1200 | 14 | 19 | 10 | 14 |
| Ex. 25 | THF | 7.6 | 5 | 65 | 30 | 56.0 | 110 | 150 | 1200 | 1600 | 11 | 15 | 8 | 11 |
| Ex. 26 | Acetone | 20.7 | 5 | 5 | 90 | 23.7 | 3 | 4 | 410 | 250 | 140 | 83 | 100 | 63 |
| Ex. 27 | Acetone | 20.7 | 5 | 25 | 70 | 35.9 | 24 | 29 | 440 | 520 | 18 | 22 | 15 | 18 |
| Ex. 28 | Acetone | 20.7 | 5 | 45 | 50 | 48.0 | 49 | 67 | 620 | 760 | 13 | 16 | 9.3 | 11 |
| Ex. 29 | Acetone | 20.7 | 5 | 65 | 30 | 60.1 | 96 | 140 | 960 | 1300 | 10 | 14 | 6.9 | 9.3 |
| Ex. 30 | Methanol | 32.6 | 3 | 3 | 94 | 34.0 | 0.5 | 7 | 44 | 73 | 88 | 150 | 6.3 | 10 |
| Ex. 31 | Methanol | 32.6 | 5 | 5 | 90 | 35.0 | 3 | 9 | 170 | 230 | 57 | 77 | 19 | 26 |
| Ex. 32 | Methanol | 32.6 | 10 | 10 | 80 | 39.9 | 22 | 43 | 730 | 410 | 33 | 19 | 17 | 9.5 |
| Ex. 33 | Ethanol | 24.6 | 5 | 5 | 90 | 27.4 | 7 | 9 | 250 | 210 | 36 | 30 | 28 | 23 |
| Comp. Ex. 4 | (Water) | (78.3) | 1 | 39.1 | 59.9 | 170 | 230 | 110 | — | 0.6 | — | 0.5 | — | |
| Comp. Ex. 5 | (Water) | (78.3) | 2 | 2 | 96 | 280 | 480 | 620 | — | 2.2 | — | 1.3 | — | |
| Comp. Ex. 6 | (Water) | (78.3) | 2 | 5 | 93 | 320 | 640 | 440 | — | 1.4 | — | 0.7 | — | |
| Comp. Ex. 7 | (Water) | (78.3) | 2 | 10 | 88 | 400 | 700 | 350 | — | 0.9 | — | 0.5 | — | |
| Comp. Ex. 8 | (Water) | (78.3) | 2 | 20 | 78 | 420 | 720 | 270 | — | 0.6 | — | 0.4 | — | |
| Comp. Ex. 9 | (Water) | (78.3) | 2 | 30 | 68 | 390 | 610 | 230 | — | 0.6 | — | 0.4 | — | |

-continued

HF-H$_2$O-isopropyl alcohol (PA) etchant

| | Solvent | Relative dielectric constant of solvent | HF concentration (%) | Water concentration (%) | Solvent (IPA) concentration (%) | Relative dielectric constant of solvent (IPA) + water (calculated value) | THOX etch rate (Å/min.) | TEOS etch rate (Å/min.) | BSG etch rate (Å/min.) | BPSG etch rate (Å/min.) | BSG/THOX selectivity | BPSG/THOX selectivity | BSG/TEOS selectivity | BPSG/TEOS selectivity |
|---|---|---|---|---|---|---|---|---|---|---|---|---|---|---|
| Comp. Ex. 10 | (Water) | (78.3) | 2 | 38.7 | 59.3 | 300 | 450 | 200 | — | 0.7 | — | 0.4 | — | |
| Ex. 34 | HCl | −8 | 0.1 | 64 | 35.9 | 17 | 32 | 440 | — | | 26 | 14 | — | |
| Ex. 35 | HCl | −8 | 0.25 | 63.9 | 35.8 | 53 | 89 | 1200 | — | | 23 | 13 | — | |
| Ex. 36 | HCl | −8 | 0.5 | 63.9 | 35.6 | 120 | 200 | 2500 | — | | 21 | 13 | — | |
| Ex. 37 | HCl | −8 | 0.75 | 63.8 | 35.5 | 180 | 300 | 4300 | — | | 24 | 14 | — | |
| Ex. 38 | HCl | −8 | 1 | 63.7 | 35.3 | 240 | 380 | 4500 | — | | 19 | 12 | — | |
| Ex. 39 | HNO3 | −1.8 | 1 | 30.4 | 68.6 | 240 | 340 | 5300 | — | | 22 | 16 | — | |
| Comp. Ex. 11 | H3PO4 | −2.15 (pKa1) 7.20 (pKa2) 12.4 (pKa3) | 1 | 15.7 | 83.3 | 120 | 170 | 850 | — | | 8.7 7.1 | 5.9 5 | — | |

The invention claimed is:

1. An etching solution consisting essentially of:
   (i) hydrofluoric acid;
   (ii) water in a concentration of 30% by weight or lower; and
   (iii) at least one member selected from the group consisting of an organic acid, an inorganic acid having a pKa at 25° C. of about 2 and an organic solvent having a hetero atom, whose content ranges from 70 to 99.9% by weight,
   wherein the etching solution has a ratio of an etch rate of a boron silicate glass film (BSG) or boron phosphosilicate glass/an etch rate of a thermal oxide film (THOX) at 25° C. of 20 or higher.

2. The etching solution according to claim 1, wherein the organic solvent has a relative dielectric constant of 61 or lower.

3. The etching solution according to claim 1, wherein the organic solvent is isopropyl alcohol.

4. The etching solution according to claim 1, wherein the organic acid is acetic acid.

5. The etching solution according to claim 1, wherein the organic solvent comprises tetrahydrofuran.

6. The etching solution according to claim 1, wherein the organic solvent is acetone.

7. The etching solution according to claim 1, wherein the organic solvent comprises methanol.

8. The etching solution according to claim 1, wherein the organic solvent comprises ethanol.

\* \* \* \* \*